US008815476B2

(12) United States Patent
Kozeki (10) Patent No.: US 8,815,476 B2
(45) Date of Patent: Aug. 26, 2014

(54) PELLICLE MEMBRANE

(75) Inventor: Takashi Kozeki, Otake (JP)

(73) Assignee: Mitsui Chemicals, Inc., Minato-ku, Tokyo (JP)

( * ) Notice: Subject to any disclaimer, the term of this patent is extended or adjusted under 35 U.S.C. 154(b) by 69 days.

(21) Appl. No.: 13/805,724

(22) PCT Filed: Jun. 29, 2011

(86) PCT No.: PCT/JP2011/003705
§ 371 (c)(1),
(2), (4) Date: Dec. 20, 2012

(87) PCT Pub. No.: WO2012/004950
PCT Pub. Date: Jan. 12, 2012

(65) Prior Publication Data
US 2013/0095417 A1    Apr. 18, 2013

(30) Foreign Application Priority Data
Jul. 8, 2010    (JP) ................................ 2010-156194

(51) Int. Cl.
*G03F 1/62* (2012.01)
(52) U.S. Cl.
USPC ............................................................ 430/5
(58) Field of Classification Search
CPC .................................. G03F 1/62; C08F 12/20
USPC ........................................ 430/5, 322; 428/14
See application file for complete search history.

(56) References Cited

U.S. PATENT DOCUMENTS

| 5,061,024 | A | 10/1991 | Keys |
| 5,286,567 | A | 2/1994 | Kubota et al. |
| 6,620,555 | B1 * | 9/2003 | Shigematsu ...................... 430/5 |
| 2003/0073795 | A1 | 4/2003 | Arakii et al. |
| 2005/0202252 | A1 | 9/2005 | Tregub et al. |
| 2008/0248406 | A1 | 10/2008 | Shirasaki |

FOREIGN PATENT DOCUMENTS

| CN | 101281363 A | 10/2008 |
| JP | 3-174450 A | 7/1991 |
| JP | 06-230561 A | 8/1994 |
| JP | 09-319073 A | 12/1997 |

(Continued)

OTHER PUBLICATIONS

International Search Report (PCT/ISA/210) issued on Oct. 4, 2011, by the Japanese Patent Office as the International Searching Authority for International Application No. PCT/JP2011/003705.

(Continued)

*Primary Examiner* — Stephen Rosasco
(74) *Attorney, Agent, or Firm* — Buchanan Ingersoll & Rooney P.C.

(57) ABSTRACT

The purpose of the present invention is to produce a pellicle film, which is suppressed in light deterioration or photodecomposition due to lithography light exposure, by simpler processes. Specifically disclosed is a pellicle film for lithography containing an amorphous fluoropolymer, which is characterized by containing 5-800 ppm by mass of a fluorine-based solvent. Also specifically disclosed is a method for producing a pellicle film, which comprises: a step A wherein a coating film of a solution that contains an amorphous fluoropolymer and a fluorine-based solvent is formed; and a step B wherein the fluorine-based solvent in the coating film is removed. The method for producing a pellicle film is characterized in that 5-800 ppm by mass of the fluorine-based solvent is caused to remain in the coating film in the step B.

7 Claims, 5 Drawing Sheets

(56) References Cited

FOREIGN PATENT DOCUMENTS

| | | |
|---|---|---|
| JP | 2000-258895 A | 9/2000 |
| JP | 2000-275817 A | 10/2000 |
| JP | 2000-305255 A | 11/2000 |
| JP | 2003-057803 A | 2/2003 |
| JP | 2006-039408 A | 2/2006 |
| JP | 2008-216616 A | 9/2008 |
| JP | 2008-276195 A | 11/2008 |

OTHER PUBLICATIONS

Extended European Search Report dated Oct. 24, 2013, issued by the European Patent Office in corresponding European Application No. 11803291.1 (4 pgs).

* cited by examiner

PELLICLE MEMBRANE

TECHNICAL FIELD

The present invention relates to pellicle membranes and processes of manufacturing the same.

BACKGROUND ART

The manufacture of semiconductor devices such as LSIs uses lithography technology to form patterns on semiconductor wafers. More specifically, exposure light is directed through a patterned exposure substrate onto a photoresist film deposited on the semiconductor wafer, to transfer the pattern onto the semiconductor wafer. When there are dust particles attached to the exposure substrate, it may result in, for instance, the deformation of the transferred pattern, giving rise to reduced semiconductor device performance or reduced manufacturing yield. Therefore, a pellicle—a dustproof cover that exhibits very high light transmittance—is attached to the surface of the exposure substrate in order to avoid possible attachment of dust particles to the exposure substrate. Even when dust particles are attached to the pellicle, deformation of the transferred pattern does not occur because exposure light has been focused on the exposure substrate.

Figure 3:
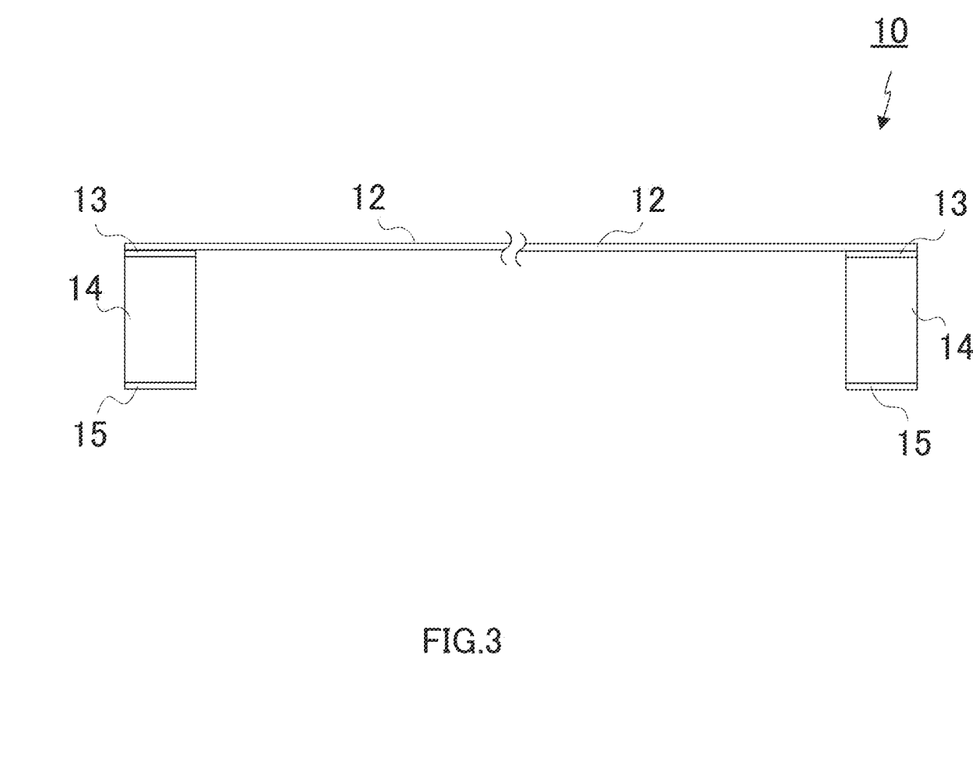
FIG. 3 is an illustration of a structure of a pellicle.

By way of example, as illustrated in FIG. 3, pellicle 10 includes pellicle membrane 12 that is transparent to exposure light, and pellicle frame 14 having pellicle membrane 12 attached. The material of pellicle membrane 12 is typically nitrocellulose, cellulose acetate or fluorine resin, for example. The material of pellicle frame 14 is typically aluminum, stainless steel or polyethylene, for example. Pellicle membrane 12 and pellicle frame 14 may be bonded together via adhesive layer 13.

Pellicle 10 further includes sticky layer 15 provided on the bottom part of pellicle frame 14. Pellicle 10 is attached to an exposure substrate via sticky layer 15. Sticky layer 15 is made of a binder such as polybutene resin, polyvinyl acetate resin, acrylic resin or silicone resin. Pellicle 10 may further include a releasable layer (not shown) for protecting sticky layer 15.

For a high lithography resolution, the wavelength of the exposure light needs to be shortened. Currently, far ultraviolet light (KrF excimer laser (wavelength: 248nm)) has been used as exposure light, with vacuum-ultraviolet light (ArF excimer laser (193nm)) being increasingly used. Because short-wavelength exposure light carries high photon energy, pellicles become prone to photodeterioration or photodecomposition.

As pellicle membranes are made of organic material, they are particularly prone to photodeterioration or photodecomposition owing to the increasing usage of shorter wavelengths for exposure light. Photodeterioration or photodecomposition of the pellicle membrane results in a problem of reduced thickness and therefore diminished exposure light transmittance. This also triggers radical-induced cleavage and recombination of polymer chains in the pellicle membrane, resulting in changes in the refraction index of the polymer. These changes in light transmittance or refraction index leads to reduced patterning precision.

Approaches have been proposed to limit such photodeterioration or photodecomposition of pellicle membranes. One proposed approach involves treating a pellicle membrane, which is composed of an amorphous perfluoropolymer, with fluorine gas on its surface to form thereon a fluorinated layer that limits photodeterioration or photodecomposition (see Patent Literature 1). Another proposed approach involves fluorinating terminal groups of an amorphous perfluoropolymer of an amorphous perfluoropolymer-based pellicle membrane to limit photodeterioration or photodecomposition. Fluorination of the polymer's terminal groups is reportedly accomplished by blowing a mixture gas of fluorine gas and inert gas into a fluorine-containing solvent solution containing amorphous perfluoropolymer (see Patent Literature 2).

CITATION LIST

Patent Literature

[PTL 1] Japanese Patent Application Laid-Open No. 2000-258895
[PTL 2] Japanese Patent Application Laid-Open No. 2000-275817

SUMMARY OF INVENTION

Technical Problem

As described above, pellicle membranes may experience photodeterioration or photodecomposition by exposure light used in lithography. Approaches have been proposed to limit photodeterioration or photodecomposition, e.g., forming a fluorinated layer on the membrane's surface or fluorinating polymer's terminal groups; however, these methods require a special treatment that uses fluorine gas, which not only makes the manufacturing process of pellicle membranes cumbersome and complicated, but may allow foreign particles to adhere to the pellicle membrane during the fluorine gas treatment.

It is therefore an object of the present invention to achieve simple manufacture of pellicle membranes that undergo limited photodeterioration or photodecomposition by exposure light.

Solution to Problem

The inventor established that pellicle membranes that contain a specific amount of fluorine-containing solvent undergo limited photodeterioration or photodecomposition by exposure light. On the other hand, pellicle membranes may typically be manufactured by applying solutions of materials of the pellicle membrane (e.g., fluorinated resins such as amorphous fluoropolymers) in fluorine-containing solvents by spin coating to form coated films, and drying the coated films. The inventor then established that pellicle membranes that undergo limited photodeterioration or photodecomposition can be readily manufactured by adjusting the conditions under which the coated films are dried.

Namely, a first aspect of the present invention relates to pellicle membranes and pellicles given below.

[1] A pellicle membrane for lithography, including:
   an amorphous fluoropolymer; and
   a fluorine-containing solvent in an amount of 5 to 800 ppm by weight.
[2] The pellicle membrane according to [1], wherein the amorphous fluoropolymer is an alicyclic perfluoropolymer having a cyclic structure in a backbone thereof.
[3] The pellicle membrane according to [1], wherein the fluorine-containing solvent is capable of dissolving the amorphous fluoropolymer.
[4] The pellicle membrane according to [3], wherein the fluorine-containing solvent is a perfluoroalkylamine.
[5] The pellicle membrane according to [1], wherein a wavelength of lithography exposure light for the pellicle membrane for lithography is 200, nm or less.

[6] A pellicle including:
   the pellicle membrane according to [1]; and
   a pellicle frame having the pellicle membrane attached thereto.

A second aspect of the present invention relates to a process of manufacturing a pellicle membrane given below.

[7] A process for manufacturing a pellicle membrane, including:
   step A of depositing a coated film from a solution containing an amorphous fluoropolymer and a fluorine-containing solvent; and
   step B of removing the fluorine-containing solvent contained in the coated film,
   wherein in step B the fluorine-containing solvent is allowed to remain in the coated film in an amount of 5 to 800 ppm by weight.

Advantageous Effects of Invention

A pellicle membrane according to the present invention undergoes limited photodeterioration or photodecomposition by exposure light. Therefore, even when the pellicle membrane is employed for lithography using short-wavelength exposure light (e.g., ArF vacuum-ultraviolet light (ArF excimer laser (193nm))), patterning precision can be maintained for a long period of time. Moreover, the pellicle membrane according to the present invention can be simply manufactured without having to add a special treatment step in a typical manufacturing process.

DESCRIPTION OF EMBODIMENTS

Pellicle Membrane

A pellicle membrane according to the present invention contains an amorphous fluoropolymer as a main component. The term "amorphous" as used herein means that no distinct diffraction phenomena are seen by X-ray diffraction. This is because amorphous fluoropolymers exhibit high transmittance for excimer lasers as well as has solubility in solvent. It is required that the amorphous fluoropolymers be such resins that enable designing of pellicle membrane thickness that allows at least 99% of 193nm-wavelength light to pass through. Moreover, the amorphous fluoropolymers are required to exist as self-sustaining membranes when formed into films having a thickness of 1μm or less. The term "self-sustaining membrane" means a membrane that displays no wrinkles or slacks when attached to a pellicle frame.

The amorphous fluoropolymers may be alicyclic perfluoropolymers having a cyclic structure in the backbone or may be linear perfluoropolymers free from any cyclic structure in the backbone.

The alicyclic perfluoropolymers having a cyclic structure in the backbone may be, for example, polymers having as a repeat unit a cyclic perfluoroether moiety having the formula shown below. Specific examples of the alicyclic perfluoropolymers are given in JP-A No. 2000-275817 and other literatures. Reference may be made to such literatures.

where m is 0 or 1; and n is in the range of 10 to 1×10⁴

Examples of the alicyclic perfluoropolymers include CYTOP (Asahi Glass, Co., Ltd.).

The linear perfluoropolymers free from any cyclic structure in the backbone may be, for example, polymers having a repeat unit having the formula shown below. Specific examples of the linear perfluoropolymers are given in JP-A No. 2003-057803 and other literatures. Reference may be made to such literatures.

where $X^1$ and $X^2$ independently represent H or F; $X^3$ represents H, F, $CH_3$ or $CF_3$; $X^4$ and $X^5$ independently represent H, F or $CF_3$; and a, b, and c are independently 0 or 1

When a is 0, Rf represents at least one group selected from $C_{4-100}$ linear or branched fluoroalkyl groups in which at least one hydrogen atom of $C_{4-100}$ alkyl groups is replaced by a fluorine atom or $C_{4-100}$ linear or branched ether linkage-containing fluoroalkyl groups in which at least one hydrogen atom of $C_{4-100}$ alkyl groups is replaced by a fluorine atom. When a is 1, Rf represents at least one group selected from $C_{3-99}$ linear or branched fluoroalkyl groups in which at least one hydrogen atom of $C_{3-99}$ alkyl groups is replaced by a fluorine atom or $C_{3-99}$ linear or branched ether linkage-containing fluoroalkyl groups in which at least one hydrogen atom of $C_{3-99}$ alkyl groups is replaced by a fluorine atom.

A pellicle according to the present invention contains a fluorine-containing solvent together with the amorphous fluoropolymer. There is no particular limitation on the fluorine-containing solvent as long as it is capable of dissolving the amorphous fluoropolymer.

The fluorine-containing solvent may be either aliphatic or aromatic compound. Examples of the aliphatic fluorine-containing solvent include $CH_3CCl_2F$, $CF_3CF_2CHCl_2$, $CClF_2CF_2CHClF$, perfluorohexane, perfluoroalkylamines such as perfluorotributylamine, perfluoro(2-butyl tetrahydrofuran), methoxy-nonafluorobutane, fluorine-containing alcohols, $ClCF_2CFClCF_2CFCl_2$, tridecafluorooctane, decafluoro 3-methoxy-4(trifluoromethyl)pentane, and mixture solvents thereof.

Examples of the aromatic compound to be used as the fluorine-containing solvent include 1,3-bistrifluoromethyl benzene, benzotrifluoride, perfluorobenzene, and mixture solvents thereof.

The fluorine-containing solvent preferably has a boiling point of 100° C. or above, most preferably about 180° C. It is difficult with fluorine-containing solvents having boiling points below 100° C. to apply amorphous fluoropolymer solutions by spin coating to form coated films with uniform thickness. The reason for this is that these solvents vaporize during spinning. Moreover, there are eases where the dried film exhibits cloudiness or orange peel surface (i.e., irregularities on the surface). In the case of fluorine-containing solvents having too high boiling points, on the other hand, it takes longer time for coated films prepared from amorphous fluoropolymer solutions to dry, and therefore, the coated films may have non-uniform thickness.

Preferred examples of the fluorine-containing solvent include perfluoroalkylamines, with perfluorotrialkylamines being more preferable, and perfluorotributylamine being most preferable.

The fluorine-containing solvent content in the pellicle membrane according to the present invention is preferably 5to 800ppm by weight, more preferably 15to 800ppm by weight. When the fluorine-containing solvent content is too low, it may result in failure to sufficiently limit photodeterioration or photodecomposition of the pellicle membrane caused by exposure light, leading to, for example, reduced light transmittance. On the other hand, when the fluorine-containing solvent content is too high, the resultant pellicle membrane tends to have non-uniform thickness and thus exhibits color unevenness, imposing a negative impact on the performance of lithography.

The fluorine-containing solvent content in the pellicle membrane may be measured by headspace gas chromatography/mass spectrometry (GC/MS). More specifically, measurement may be done by loading the material of the pellicle membrane into a glass tube, heating the material to gasify the fluorine-containing solvent, and subjecting the gasified solvent to quantification by GC/MS.

The thickness of the pellicle membrane according to the present invention is preferably set to 1μm or less. Preferably, the thickness of the pellicle membrane is precisely set according to the wavelength and incident angle of exposure light such that light transmittance due to optical interference effect becomes high.

The thickness of the pellicle membrane needs to be set extremely precisely, e.g., with nanometer precision. The reason for this that light transmittance of the pellicle membrane greatly varies even with slight (i.e., nanometer) changes in thickness. Therefore, changes in the thickness of the pellicle membrane during usage should be limited as much as possible. The conventional pellicle membranes, however, exhibit a thickness change (i.e., reduction) when irradiated with exposure light for a long period of time. The thickness reduction rate tends to increase especially when irradiated with short-wavelength exposure light. The conventional pellicle membranes thus suffer from a drawback of shorter life. The pellicle membrane according to the present invention is less likely to undergo a thickness reduction even when irradiated with short-wavelength exposure light, and therefore, has longer life.

There are no particular limitations on the mechanism by which the photodeterioration or photodecomposition of the pellicle membrane according to the present invention is limited; there are two possible mechanisms:

1) Stabilization of Radicals, which are Generated by Cleavage of the C-C Linkage or C-F Linkage in the Polymer by Irradiation with Exposure Light, by the Fluorine-Containing Solvent Radicals can be stabilized particularly where a perfluorotrialkylamine is employed as the fluorine-containing solvent, because the electron density of the lone electron pair on the nitrogen atom is considered to be reduced by the perfluoroalkyl group.

2) Action of the Fluorine-Containing Solvent as a Light Absorber

Most of the exposure light directed onto the pellicle passes through the pellicle membrane, but some of the exposure light is absorbed in the pellicle membrane. The fluorine-containing solvent is considered to absorb the exposure light absorbed in the pellicle membrane. The exposure light absorbed by the pellicle membrane is considered to be responsible for the deterioration of the polymer in the pellicle membrane.

The pellicle membrane according to the present invention is attached to a pellicle frame to manufacture a pellicle, as are the conventional pellicle membranes. FIG. 3 is a schematic illustration of a pellicle. Pellicle frame 14 may be any of the conventional pellicle frames which may be made of aluminum, stainless steel or polyethylene.

A pellicle that includes the pellicle membrane according to the present invention may be used to protect an exposure substrate in the lithography process, as are the conventional pellicles. The pellicle according to the present invention is used particularly in the lithography process where short-wavelength exposure light is employed. Short-wavelength exposure light is, for example, vacuum-ultraviolet light having a wavelength of 200nm or less. Examples of the vacuum-ultraviolet light include ArF excimer laser (wavelength: 193 nm). Because of its high photon energy, short-wavelength exposure light tends to cause photodeterioration or photodecomposition of pellicle membranes, which are used for a long period of time.

Photodeterioration or photodecomposition of a pellicle membrane means, for example, a reduction in membrane thickness. The thickness reduction amount of the pellicle membrane according to the present invention, upon irradiation with ArF excimer laser at a radiation density of $1mJ/cm^2$/pulse (pulse frequency: 500Hz) to a total dose of $20kJ/cm^2$, is generally 4nm or less, preferably 2.5nm or less.

Photodeterioration or photodecomposition of a pellicle membrane also means, for example, a reduction in light transmittance of the pellicle membrane. The irradiation dose (irradiation intensity: 1 $mJ/cm^2$/pulse (pulse frequency: 400Hz)) that is required to cause a reduction in light transmittance of the pellicle membrane according to the present invention from 99.7T % to 98.0T % for ArF excimer laser is generally $40kJ/cm^2$or more, preferably $60kJ/cm^2$or more.

Process of Manufacturing Pellicle Membrane

A process according to the present invention for manufacturing a pellicle membrane includes: 1) step A of depositing a coated film from a solution containing an amorphous fluoropolymer and a fluorine-containing solvent; and 2) step B of removing the fluorine-containing solvent contained in the coated film.

In step A, an amorphous fluoropolymer, a main component of a pellicle membrane, is first dissolved into a fluorine-containing solvent to afford a solution. A portion of the fluorine-containing solvent may be allowed to remain in the resultant pellicle. There are no particular limitations on the concentration of the amorphous fluoropolymer in the solution; the concentration may be set such that the solution has a viscosity at which a uniform coated film can be deposited, which is generally 1 to 20wt %, preferably 5 to 15wt %. The solution thus prepared is preferably filtrated through a filter to remove foreign material.

A coated film is then deposited from the solution containing the amorphous fluoropolymer and fluorine-containing solvent. Deposition may be accomplished by, for example, spin coating. The substrate to be coated is, for example, a silicon substrate or a quartz glass substrate. The deposition amount may be appropriately set according to a desired thickness of the pellicle membrane to be manufactured.

The fluorine-containing solvent is then removed from the deposited coated film. Solvent removal may be accomplished by heating the coated film for drying. There are no particular limitations on the heating temperature; it may be set in the range of 100° C. to 200° C.

Upon removal of the fluorine-containing solvent from the coated film, it is preferable to allow a portion of the fluorine-containing solvent to remain in the coated film. More specifically, the fluorine-containing solvent is allowed to remain in the coated film in an amount of 5 to 800ppm by weight, preferably 15 to 800ppm by weight. The residual amount of the fluorine-containing solvent may be controlled by adjusting the heating temperature or heating time in the drying step. A pellicle membrane according to the present invention can be obtained by peeling the coated film, which contains a desired amount of the fluorine-containing solvent, off the substrate.

On the other hand, when the coated film is allowed to contain less than the desired amount of the fluorine-containing solvent upon solvent removal, a pellicle membrane according to the present invention can be obtained by placing the coated film in a fluorine-containing solvent atmosphere for solvent absorption. In some cases, however, this step is not preferable as it increases the number of steps in the manufacturing process.

EXAMPLES

The present invention will now be described in more detail with reference to Examples, which however shall not be construed as limiting the scope of the present invention.

Examples 1 to 7, Comparative Examples 1 to 4

An amorphous fluoropolymer CYTOP (code: CHX809SP2, Asahi Glass, Co., Ltd.) was dissolved into a fluorine-containing solvent perfluorotributylamine (EFL-174S, Tohkem Products, Corporation) to afford a solution containing 6wt % polymer. The solution thus obtained was filtrated through a polytetrafluoroethylene (PTFE) membrane filter (pore size: 500nm) to afford a filtrate deprived of foreign material.

The filtrate thus obtained was applied onto a surface of a quarts glass substrate (25cm×25cm) by spin coating (spin speed: 700 rpm, spin time: 60seconds) to deposit a coated film.

The coated film formed on the substrate surface was heated to 165° C. in a clean oven. The heating time was adjusted as shown in Table 1 below (in the range of 80 to 400seconds) to produce a dried film. After drying, a resin-made peeling ring was attached to the dried film on the substrate surface, and the dried film was peeled off the substrate to provide a pellicle membrane. The pellicle membrane thus obtained had a thickness of 829nm.

The amount of the fluorine-containing solvent contained in the pellicle membrane was measured by headspace GC/MS. More specifically, measurement was done by loading 100g of the membrane material into a glass tube, heating the material at 180° C. for 3minutes to gasify the fluorine-containing solvent contained in the pellicle membrane, and quantifying the gasified fluorine-containing solvent content. Measurement results are given in Table 1.

Measurement Condition (1) Measurement of Fluorine-Containing Solvent Content

GC/MS equipment: 6890/5973-GC-MS (Agilent Technologies)

Column: HT-1

Temperature program: heating from 40° C. to 320° C. at a heating rate of 15° C./min, and retained at 320° C. for 5minutes.

(2) Membrane Thickness Measurement

Photo Detector System MCPD-7000(Otsuka Electronics, Co., Ltd.)

Light transmittances for light having wavelengths of 180nm to 400nm were measured, and the membrane thickness was measured with fitting simulation of the light transmittance peak by multiple-beam interferometry based on the relationship between the refraction index of the material and light transmittance.

(3) Light Transmittance Measurement

Photo Detector System MCPD-7000(Otsuka Electronics, Co., Ltd.)

Light transmittance was measured for 193nm-wavelength light.

TABLE 1

|  | Drying time (sec) | Fluorine-based solvent content (ppm by weight) |
|---|---|---|
| Comp. Ex. 1 | 400 | 0.5 |
| Comp. Ex. 2 | 380 | 1.8 |
| Ex. 1 | 350 | 7 |
| Ex. 2 | 300 | 17 |
| Ex. 3 | 280 | 25 |
| Ex. 4 | 250 | 64 |
| Ex. 5 | 210 | 104 |
| Ex. 6 | 150 | 480 |
| Ex. 7 | 125 | 800 |
| Comp. Ex. 3 | 100 | 1,013 |
| Comp. Ex. 4 | 80 | 2,300 |

Each of the pellicle membranes prepared in Examples 1 to 7 and Comparative Examples 1 to 4 was irradiated with ArF excimer laser. The irradiation density was set to 1mJ/cm$^2$/pulse, and laser oscillation frequency to 500Hz.

Figure 1:
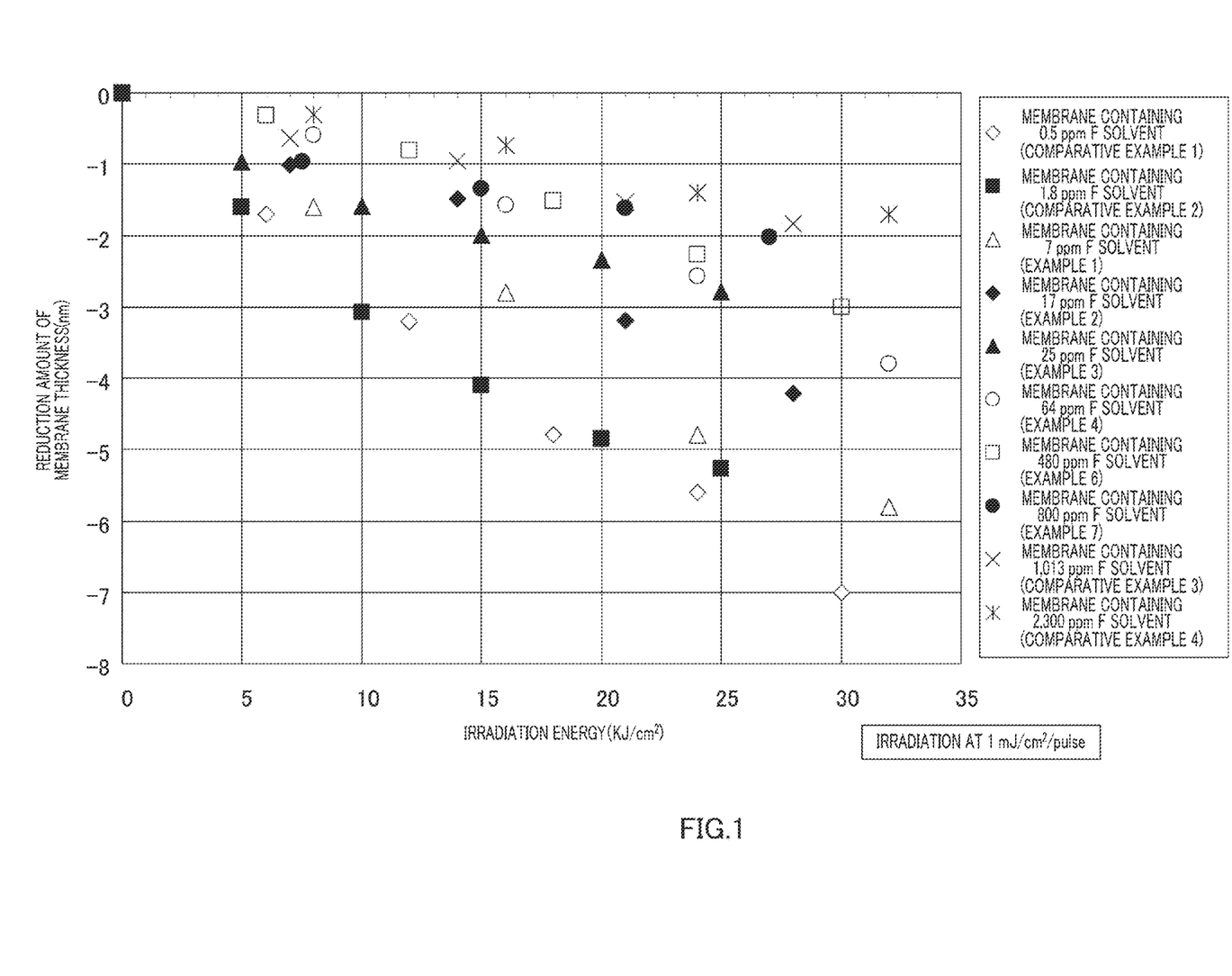
FIG. 1 is a graph of reduction amount of pellicle membrane thickness vs. irradiation energy on the pellicle membrane, for different fluorine-containing solvent contents in the pellicle membrane.

The graph shown FIG. 1 is a graph of reduction amount of pellicle membrane thickness (Y axis) vs. irradiation energy of ArF excimer laser (X axis). The data for Comparative Example 1(solvent content: 0.5ppm by weight) is denoted by blank diamond; the data for Comparative Example 2(solvent content: 1.8ppm by weight) by solid square; the data for Example 1(solvent content: 7ppm by weight) by blank triangle; the data for Example 2(solvent content: 17ppm by weight) by solid diamond; the data for Example 3(solvent content: 25 ppm by weight) by solid triangle; the data for Example 4(solvent content: 64ppm by weight) by blank circle; the data for Example 6 (solvent content: 480ppm by weight) by blank square; the data for Example 7(solvent content: 800ppm by weight) by solid circle; the data for Comparative Example 3(solvent content: 1,013ppm by weight) by X; and the data for Comparative Example 4(solvent content: 2,300 ppm by weight) by asterisk. It can be seen that the reduction amount of membrane thickness decreases with increasing solvent content. When the fluorine-containing solvent content exceeds 800ppm by weight, the pellicle membrane exhibited color unevenness on its surface.

The reduction amount of membrane thickness was determined as follows: in the manner as described above, light transmittances for light having wavelengths of 180nm to 400nm were measured followed by measurement of the membrane thickness based on the relationship between the refraction index of the material and light transmittance, and the difference in membrane thickness between before and after ArF excimer laser irradiation was found.

Figure 2:
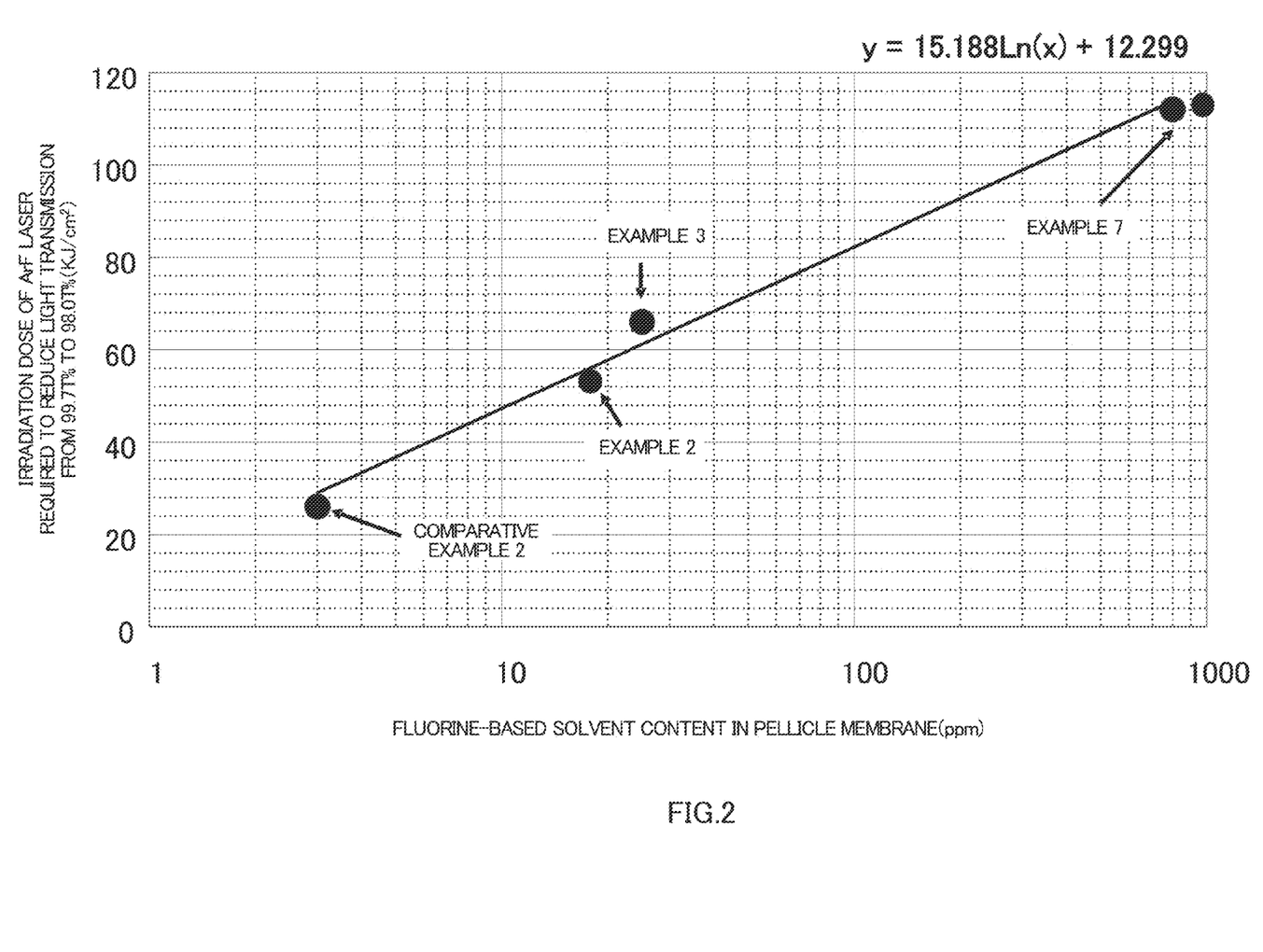
FIG. 2 is a graph of irradiation energy required to reduce the light transmittance of pellicle membrane by a specific amount vs. amount of fluorine-containing solvent in the pellicle membrane.

The graph shown in FIG. 2 is a graph of irradiation energy required to cause a reduction in light transmittance of the pellicle membrane from 99.7T % to 98.0T % for ArF excimer laser vs. fluorine-containing solvent content (ppm by weight) in the pellicle membrane. It can be seen that the higher the fluorine-containing solvent content, the higher the required irradiation dose, i.e., the less it is likely that light transmittance decreases. However, as described above, when the fluorine-containing solvent content exceeds 800, ppm by weight, the pellicle membrane exhibited color unevenness on its surface.

The pellicle membrane prepared in Comparative Example 4 that exhibited color unevenness on its surface was measured for thickness distribution across its surface. Measurements were made on 49 equally-spaced points within a 112mm×139mm region positioned at least 5mm inward from the edges of the pellicle frame. The measurement results indicate that membrane thickness variation was large, with a maximum membrane thickness and a minimum membrane thickness being 835.3nm and 824.8nm, respectively. It can be deduced that color unevenness was caused by membrane thickness variation.

Comparative Example 5

A pellicle membrane was prepared in the same manner as in Example 1 except that drying temperature was set to 150° C. and drying time to 20 minutes. In the same manner as in Example 1, the fluorine-containing solvent contained in the pellicle membrane was gasified, and the amount of the gasified fluorine-containing solvent was measured. The fluorine-containing solvent content was 0.7ppm by weight.

Comparative Example 6

A pellicle membrane was prepared in the same manner as in Example 1 except that drying temperature was set to 180° C. and drying time to 5 minutes. In the same manner as in Example 1, the fluorine-containing solvent contained in the pellicle membrane was gasified, and the amount of the gasified fluorine-containing solvent was measured. The fluorine-containing solvent content was 0.7ppm by weight.

The conditions used in Comparative Examples 5 and 6 are conditions commonly used for the manufacture of pellicle membranes. Under such conditions commonly used for the manufacture of pellicle membranes, the fluorine-containing solvent content in the pellicle membrane was below 5ppm by weight.

Examples 8 to 11, Comparative Example 7

Pellicle membranes were prepared in the same manner as in Example 1 except that the spin coating condition was changed and that the drying temperatures and drying times given in Table 2 were used. The pellicle membranes obtained had a thickness of 281nm. In the same manner as in Example 1, the fluorine-containing solvent contained in the pellicle membrane was gasified, and the amount of the gasified fluorine-containing solvent was measured. The fluorine-containing solvent contents are given in Table 2.

TABLE 2

| | Drying temp. (° C.) | Drying time (sec) | Fluorine-based solvent content (ppm by weight) |
|---|---|---|---|
| Comp. Ex. 7 | 165 | 380 | 3 |
| Ex. 8 | 165 | 350 | 7 |
| Ex. 9 | 165 | 320 | 13 |
| Ex. 10 | 165 | 290 | 16 |
| Ex. 11 | 165 | 260 | 27 |

Each of the pellicle membranes prepared in Example 11 and Comparative Example 7 was irradiated with ArF excimer laser in the same manner as in Example 1. The irradiation density was set to 1 mJ/cm$^2$/pulse, and laser oscillation frequency to 500Hz.

Figure 4:
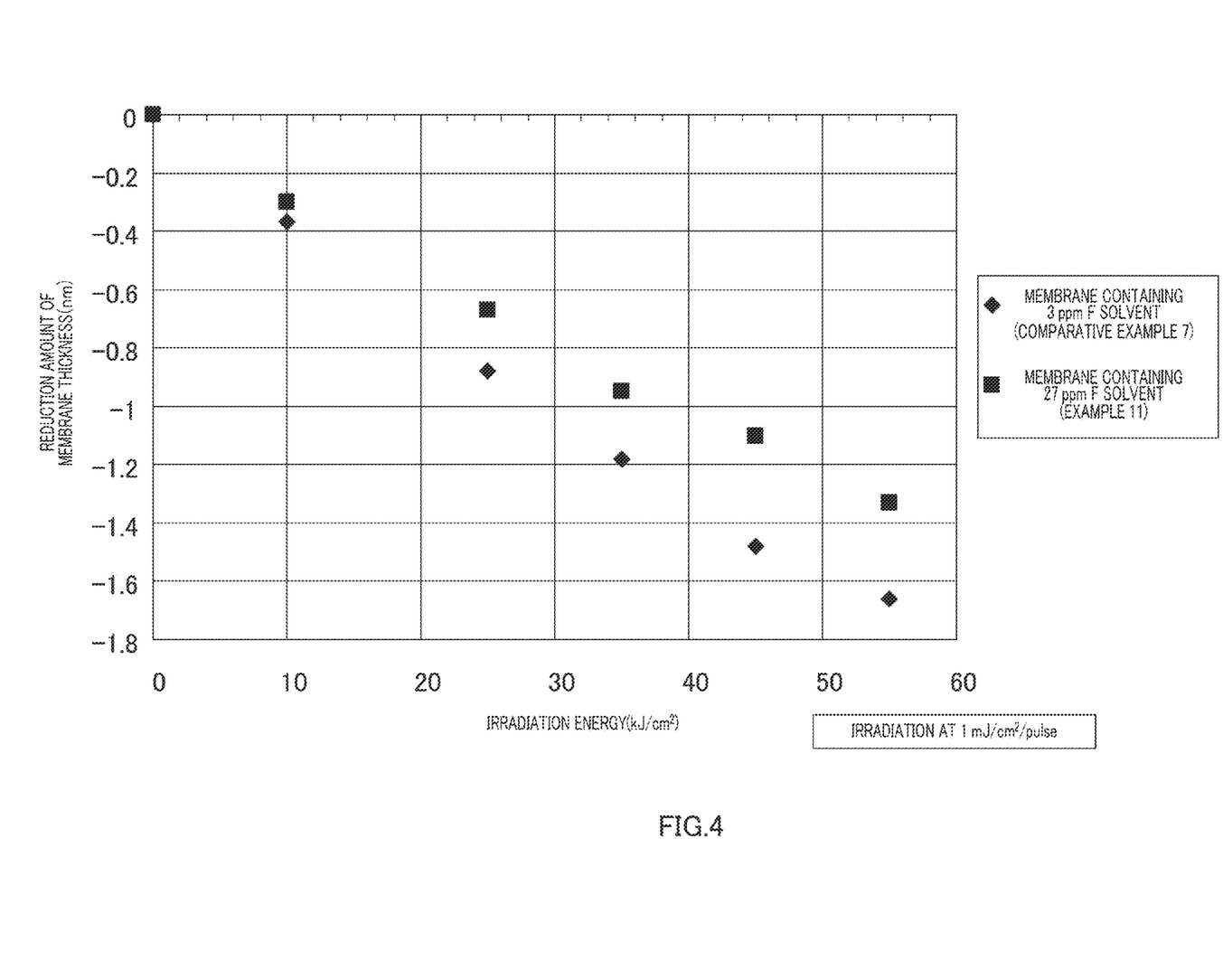
FIG. 4 is another graph of reduction amount of pellicle membrane thickness vs. irradiation energy on the pellicle membrane, for different fluorine-containing solvent contents in the pellicle membrane.

The graph shown in FIG. 4 is a graph of reduction amount of pellicle membrane thickness (Y axis) vs. irradiation energy of ArF excimer laser (X axis). The data for Comparative Example 7 (solvent content: 3ppm by weight) is denoted by solid diamond; and the data for Example 11 (solvent content: 27ppm by weight) by solid square. It was established that even when the membrane thickness was reduced, the increased residual solvent content limited a reduction in membrane thickness.

Examples 12 and 15

The pellicle membrane prepared in Comparative Example 2, was allowed to absorb a fluorine-containing solvent through the procedure described below.
(Procedure)
The pellicle membrane prepared in Comparative Example 2 was placed in a 6,800ml sealed glass container followed by the addition of solvents given in Table 3 in amounts specified in Table 3. After conditioning the solvent atmosphere, the pellicle membrane was allowed to stand for 24 hours. The amount of the solvent absorbed in the pellicle membrane was measured by GC/MS equipment in the same manner as in Example 1. The types and added amounts of the fluorine-containing solvents, and the amounts of the fluorine-containing solvents absorbed in the pellicle membrane are given in Table 3.
(Fluorine-Based Solvents)
Solvent 1:
1,1,1,2,2,3,3,4,4,5,5,6,6-tridecafluorooctane (AC-6000, Asahi Glass Co., Ltd.); boiling point: 114° C.
Solvent 2:
1,1,1,2,2,3,4,5,5,5-decafluoro-3-methoxy-4(trifluoromethyl)-pentane (CT-solv.100E, Asahi Glass Co., Ltd.); boiling point: 97° C.

TABLE 3

| | Solvent | Amount added (mg) | Fluorine-based solvent content (ppm by weight) |
|---|---|---|---|
| Ex. 12 | AC-6000 | 2 | 24 |
| Ex. 13 | AC-6000 | 4 | 32 |
| Ex. 14 | CT-solv. 100E | 2 | 15 |
| Ex. 15 | CT-solv. 100E | 4 | 23 |

Figure 5:
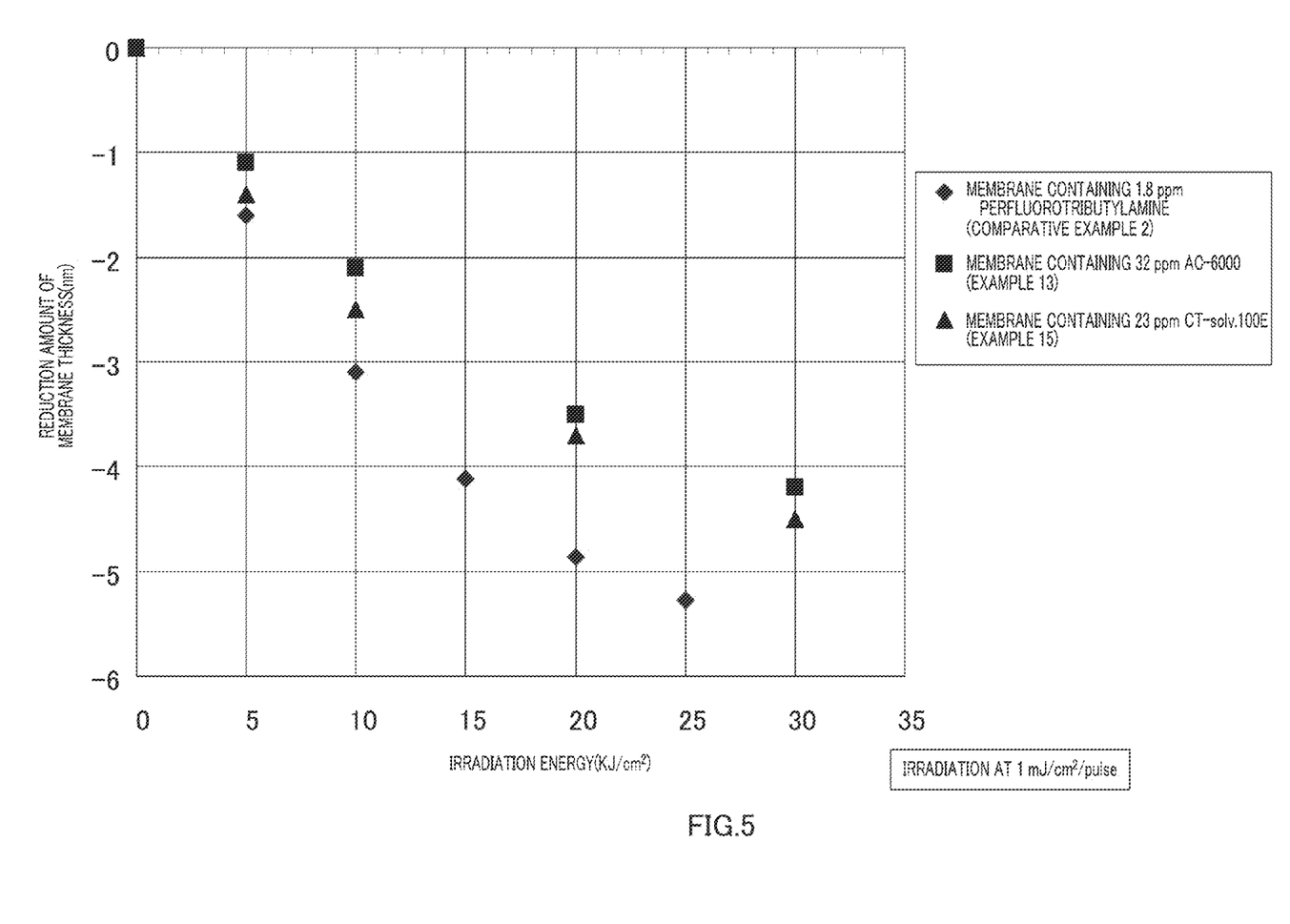
FIG. 5 is still another graph of reduction amount of pellicle membrane thickness vs. irradiation energy on the pellicle membrane, for different fluorine-containing solvent contents in the pellicle membrane.

Each of the pellicle membranes prepared in Examples 13 and 15 was irradiated with ArF excimer laser in the same manner as in Example 1. The irradiation density was set to 1mJ/cm$^2$/pulse, and laser oscillation frequency to 500Hz. The graph shown in FIG. 5 is a graph of reduction amount of pellicle membrane thickness (Y axis) vs. irradiation energy of ArF excimer laser (X axis). The data for Comparative Example 2(solvent content: 1.8ppm by weight) is denoted by solid diamond; the data for Example 13(solvent content: 32ppm by weight) by solid square; and the data for Example 15(solvent content: 23ppm by weight) by solid triangle. It can be seen that as long as such fluorine-containing solvents that can dissolve amorphous fluoropolymers are used, they limit a reduction in membrane thickness and therefore improve lightfastness with increasing solvent content, regardless of their types.

Industrial Applicability

A pellicle membrane according to the present invention undergoes limited photodeterioration or photodecomposition even when used in a lithography pellicle for short-wavelength exposure light (e.g., ArF vacuum-ultraviolet light (ArF excimer laser (193nm))), thus contributing to longer pellicle life. Moreover, the pellicle membrane according to the present invention can be simply manufactured without having to add a special treatment step in the conventional manufacturing process for pellicle membranes.

| Reference Signs List | |
|---|---|
| 10 | Pellicle |
| 12 | Pellicle membrane |
| 13 | Adhesive layer |
| 14 | Pellicle frame |
| 15 | Sticky layer |

The invention claimed is:

1. A pellicle membrane for lithography, comprising:
   an amorphous fluoropolymer; and
   a fluorine-containing solvent in an amount of 5 to 800 ppm by weight.

2. The pellicle membrane according to claim 1, wherein the amorphous fluoropolymer is an alicyclic perfluoropolymer having a cyclic structure in a backbone thereof.

3. The pellicle membrane according to claim 1, wherein the fluorine-containing solvent is capable of dissolving the amorphous fluoropolymer.

4. The pellicle membrane according to claim 3, wherein the fluorine-containing solvent is a perfluoroalkylamine.

5. The pellicle membrane according to claim 1, wherein a wavelength of lithography exposure light for the pellicle membrane for lithography is 200 nm or less.

6. A pellicle comprising:
   the pellicle membrane according to claim 1; and
   a pellicle frame having the pellicle membrane attached thereto.

7. A process for manufacturing a pellicle membrane, comprising:
   step A of depositing a coated film from a solution containing an amorphous fluoropolymer and a fluorine-containing solvent; and
   step B of removing the fluorine-containing solvent contained in the coated film,
   wherein in step B the fluorine-containing solvent is allowed to remain in the coated film in an amount of 5 to 800 ppm by weight.

* * * * *